United States Patent

Lange et al.

(10) Patent No.: US 7,635,613 B2
(45) Date of Patent: Dec. 22, 2009

(54) SEMICONDUCTOR DEVICE HAVING FIRMLY SECURED HEAT SPREADER

(75) Inventors: Bernhard P. Lange, Garland, TX (US); Steven A. Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 11/168,000

(22) Filed: Jun. 27, 2005

(65) Prior Publication Data

US 2006/0289971 A1 Dec. 28, 2006

(51) Int. Cl.
*H01L 23/495* (2006.01)

(52) U.S. Cl. .................. 438/123; 257/675; 257/676; 257/E23.047; 438/124; 438/127

(58) Field of Classification Search .................. None
See application file for complete search history.

(56) References Cited

U.S. PATENT DOCUMENTS

| | | | | |
|---|---|---|---|---|
| 3,778,887 | A * | 12/1973 | Suzuki et al. .................. | 29/827 |
| 4,961,107 | A | 10/1990 | Giest et al. | |
| 5,053,855 | A * | 10/1991 | Michii et al. ................. | 257/675 |
| 5,105,259 | A | 4/1992 | McShane et al. | |
| 5,345,106 | A * | 9/1994 | Doering et al. ............. | 257/675 |
| 5,394,607 | A | 3/1995 | Chiu et al. | |
| 5,442,234 | A * | 8/1995 | Liang .......................... | 257/675 |
| 5,598,034 | A * | 1/1997 | Wakefield .................... | 257/706 |
| 5,750,423 | A * | 5/1998 | Ishii ............................ | 438/112 |
| 5,783,860 | A * | 7/1998 | Jeng et al. .................... | 257/675 |
| 5,864,174 | A * | 1/1999 | Yamada et al. .............. | 257/676 |
| 6,303,985 | B1 * | 10/2001 | Larson et al. ................ | 257/676 |
| 6,627,481 | B2 * | 9/2003 | Lee et al. ..................... | 438/112 |
| 6,639,306 | B2 * | 10/2003 | Huang ......................... | 257/667 |
| 6,891,254 | B2 * | 5/2005 | Taniguchi ................... | 257/667 |
| 2003/0104656 | A1 | 6/2003 | Ahmad | |
| 2006/0006510 | A1 * | 1/2006 | Koduri ........................ | 257/678 |

OTHER PUBLICATIONS

"Packaging: designing for thermal performance" Bruce M Guenin, May, 1997 (entire document).

* cited by examiner

*Primary Examiner*—Andy Huynh
*Assistant Examiner*—Hoang-Quan T Ho
(74) *Attorney, Agent, or Firm*—Yingsheng Tung; Wade J. Brady, III; Frederick J. Telecky, Jr.

(57) ABSTRACT

A semiconductor device comprising a leadframe (903), which has first (903*a*) and second (903*b*) surfaces, a planar pad (910) of a certain size, and a plurality of non-coplanar members (913) adjoining the pad. The device further has a heat spreader (920) with first (920*a*) and second (920*b*) surfaces, a planar pad of a size matching the leadframe pad size, and contours (922), into which the leadframe members are inserted so that the first spreader pad surface touches the second leadframe pad surface across the pad size. A semiconductor chip (904) is mounted on the first leadframe pad surface. Encapsulation material (930), preferably molding compound, covers the chip, but leaves the second spreader surface uncovered.

4 Claims, 6 Drawing Sheets

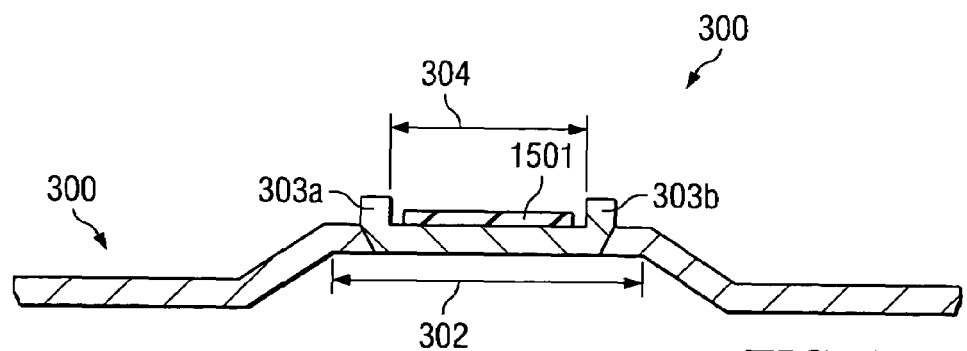
FIG. 15A
FIG. 15B
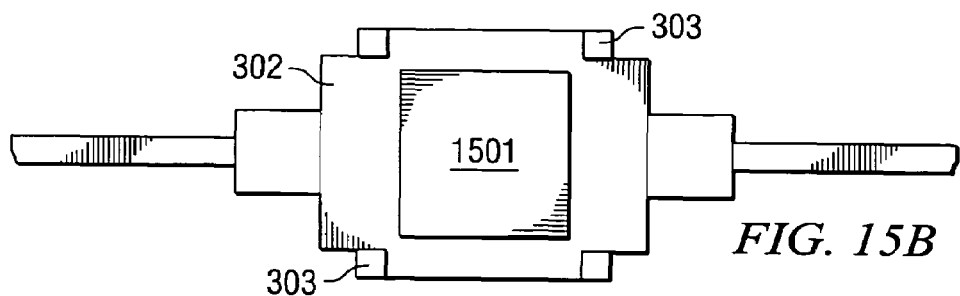
FIG. 16
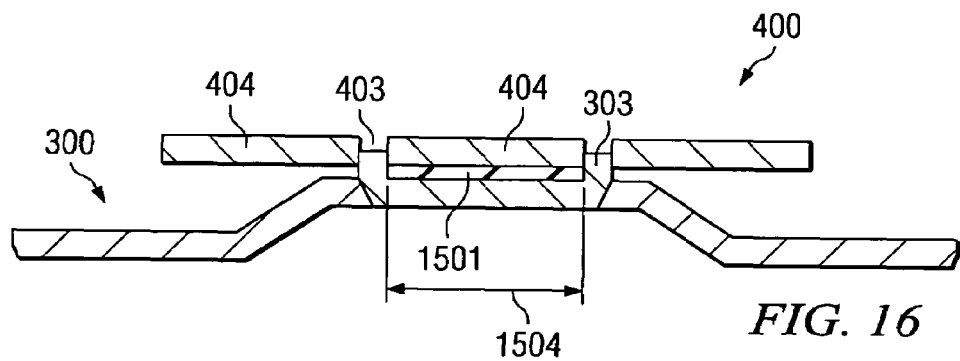
FIG. 17

SEMICONDUCTOR DEVICE HAVING FIRMLY SECURED HEAT SPREADER

FIELD OF THE INVENTION

The present invention is related in general to the field of electrical systems and semiconductor devices and more specifically to thermally enhanced semiconductor devices having metallic heat spreaders secured for reliable processing.

DESCRIPTION OF THE RELATED ART

Removing the thermal heat generated by active components belongs to the most fundamental challenges in integrated circuit technology. Coupled with the ever shrinking component feature sizes and increasing density of device integration is an ever increasing density of power and thermal energy generation. However, in order to keep the active components at their low operating temperatures and high speed, this heat must continuously be dissipated and removed to outside heat sinks. This effort becomes increasingly harder, the higher the energy density becomes.

In known technology, one approach to heat removal, specifically for devices with metallic leads, focuses on thermal transport through the thickness of the semiconductor chip from the active surface to the passive surface. The passive surface, in turn, is attached to the chip mount pad of a metallic leadframe so that the thermal energy can flow into the chip mount pad of the metallic leadframe. The layer of the typical polymer attach material represents a thermal barrier. When properly formed, the leadframe can act as a heat spreader to an outside heat sink. In many semiconductor package designs, this implies a leadframe with a portion formed such that this portion protrudes from the plastic device encapsulation; it can thus be directly attached to the outside heat sink. In application where there is no outside heat sink available, the exposed leadframe becomes less effective when the leadframe metal thickness has to be reduced driven by the trend towards thinner packages.

Another approach of known technology, specifically for ball-grid array devices without leadframes, employs a heat spreader spaced in proximity of the active surface of the semiconductor chip, at a safe distance from the electrical connections of the active surface. In this approach, the heat has to spread first through the macroscopic thickness of the molding material (typically an epoxy filled with inorganic particles, a mediocre thermal conductor) and only then into a metallic heat spreader. Frequently, the spreader is positioned on the surface of the molded package; in other devices, it is embedded in the molded package.

The approach to add ("drop in") a heat spreader to the assembled device is generally plagued by the need to stabilize the spreader for the molding process; otherwise, rotational and/or lateral movements may occur during the molding step.

SUMMARY OF THE INVENTION

The applicants recognized a need for a concept of a low-cost, thermally improved and mechanically stabilized structure, which is not only robust relative to the transfer molding process, but also flexible enough to be applied to different semiconductor product families and compatible with the industry trend towards thinner device packages. The new structure should not only meet high thermal and electrical performance requirements, but should also achieve improvements towards the goals of enhanced process yields and device reliability.

When applied to devices which require a predetermined range of operating temperature, the present invention provides improved thermal performance in terms of improved heat conductance and also in terms of acting as initial heat sink, especially for package families having exposed thermal pads. One embodiment of the invention is a leadframe, which has a planar pad operable for mounting a workpiece and a plurality of non-coplanar members operable as mechanical stabilizers configured to secure inserted objects. The leadframe may be made from a planar metal sheet. The leadframe members adjoin the pad, and the non-coplanarity of these members is provided by a bend in these members near their attachment to the leadframe.

Another embodiment of the invention is an apparatus, which consists of a leadframe and a heat spreader. The leadframe includes a pad operable for mounting a heat-generating workpiece, and a plurality of non-coplanar members operable as mechanical stabilizers configured to secure inserted objects, whereby the members abut the pad. Examples for a workpiece include workpiece a semiconductor chip or multi-chip, or a micro-machined device, and examples for an inserted object include heat spreaders and heat sinks. Examples for a heat spreader also include heat sinks, which keep the workpiece within a predetermined temperature range. The heat spreader has a planar pad matching the leadframe pad size, and contours suitable for insertion of the leadframe members. The leadframe members are inserted into the spreader contours so that the leadframe pad touches the spreader pad across the pad size.

In the preferred embodiment, the heat spreader has contours, which match the leadframe members in number, location, and size so that the leadframe members fit into the spreader contours to stabilize and secure the spreader relative to the leadframe during a stressful encapsulation process such as a molding process.

Another embodiment of the invention is a device comprising a leadframe, which has first and second surfaces, a planar pad of a certain size, and a plurality of non-coplanar members adjoining the pad. The device further has a heat spreader with first and second surfaces, a planar pad of a size that matches the leadframe pad size, and contours into which the leadframe members are inserted so that the first spreader pad surface touches the second leadframe pad surface across the pad size. A heat-generating object such as a semiconductor chip or a micromechanical device is mounted on the first leadframe pad surface. Encapsulation material, preferably molding compound, covers the chip, but leaves the second spreader surface uncovered. The heat spreader is preferably made of a material and has a thickness to operate as a heat sink during the first operational phase of the semiconductor chip.

Another embodiment of the invention is a method for fabricating a semiconductor device as described above. After providing leadframe with a plurality of non-coplanar members abutting the pad and a heat spreader with contours for insertion of the members, the leadframe members are inserted into the spreader contours so that the first spreader pad surface touches the second leadframe surface pad surface across the pad size. A semiconductor chip is then provided and mounted on the first leadframe pad surface. The mounted chip is encapsulated, preferably by the transfer molding technology, while the second spreader surface remains uncovered.

It is a technical advantage of the invention that it offers low-cost design and fabrication options for the leadframe members. The members have shapes resembling elongated protrusions, dimples, or thorns, and project from the planar leadframe at an angle, which is selected between and acute and a right angle. The members are preferably stamped from the planar leadframe sheet.

It is another technical advantage that the innovation of the invention is accomplished using the installed equipment base for leadframe manufacture so that no investment in new manufacturing machines is needed.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 15A is a schematic cross section of a leadframe according to another embodiment of the invention.

FIG. 15B is a schematic top view of a leadframe according to another embodiment of the invention.

FIG. 16 is a schematic cross section of an apparatus comprising a leadframe and a heat spreader inserted into leadframe members according to another embodiment of the invention.

FIG. 17 is a schematic cross section of a semiconductor chip assembled on an apparatus comprising a leadframe and a heat spreader inserted into leadframe members according to another embodiment of the invention.

DETAILED DESCRIPTION OF THE PREFERRED EMBODIMENTS

Figure 1:
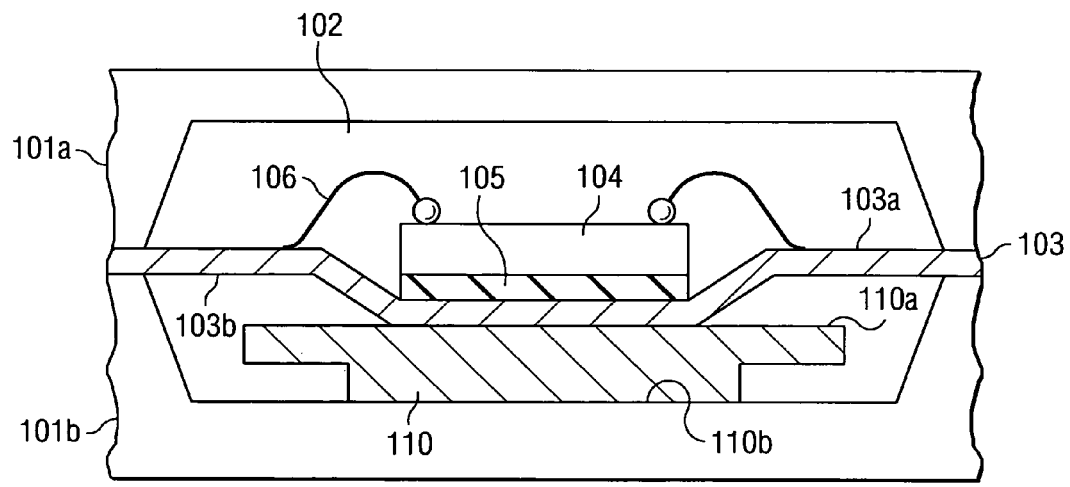
FIG. 1 is a schematic cross section of a mold containing in its cavity an arrangement of a leadframe, with assembled semiconductor chip, and a heat spreader.

The schematic cross section of FIG. 1 depicts a stainless steel mold with upper mold half 101a and lower half 101b as commonly used in the transfer molding process of semiconductor device packaging. When placed on top of each other as shown in FIG. 1, the mold halves define the mold cavity 102, which is to be filled with molding compound. A leadframe 103, frequently made of copper, has been loaded in the mold cavity; it is held in place by pressing the mold halves together. On the first surface 103a of leadframe 103 is a semiconductor chip 104 mounted. The mounting step includes the attachment of chip 104 to first leadframe surface 103a using the adhesive 105 (often an epoxy), and the electrical connection of chip bond pads to leadframe segments (only schematically shown in FIG. 1) using connecting wires 106.

Heat spreader 110, preferably made of copper, is "dropped in" cavity 102. The first surface 110a of spreader 110 faces second surface 103b of leadframe 103, and the second surface 110b of the spreader rests on the steel of the lower mold half 101b.

Figure 2:
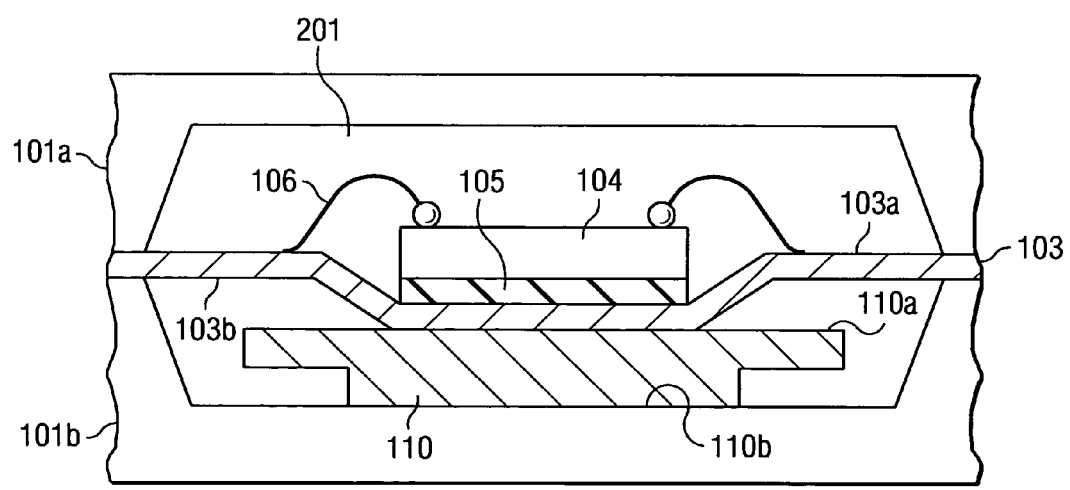
FIG. 2 illustrates schematically the effect of filling the mold cavity of FIG. 1 with molding compound: an uncontrolled shifting of the heat spreader relative to the leadframe.

When molding compound 201 is transferred into cavity 102 in known technology, spreader 110 is frequently shifted around by the progressing front of the compound as it is pressed into the mold cavity through the mold gate. The cross section of FIG. 2 illustrates schematically examples of this failure situation. Compound 201 has filled the mold cavity in FIG. 2. Spreader 110 has been pushed off-center by the incoming mold compound to one side of the cavity in FIG. 2, dependent on the location of the gate. When the finished device is removed from the mold, the spreader surface 110b is exposed to an external part in a location not defined in the device specifications: it thus has to be considered a failure.

Figure 3A:
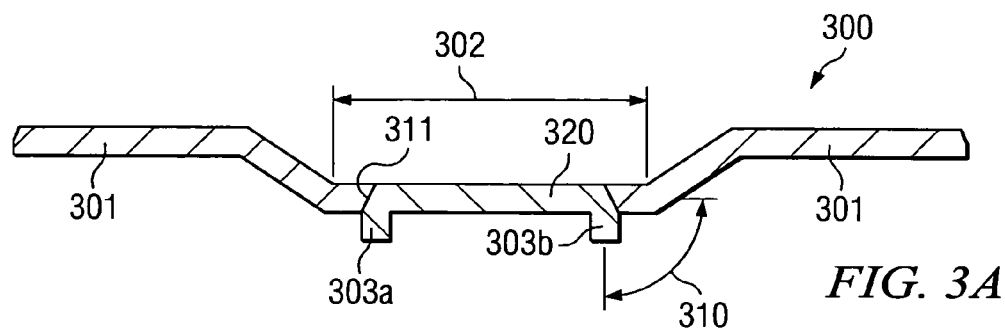
FIG. 3A is a schematic cross section of a leadframe according to an embodiment of the invention.
Figure 3B:
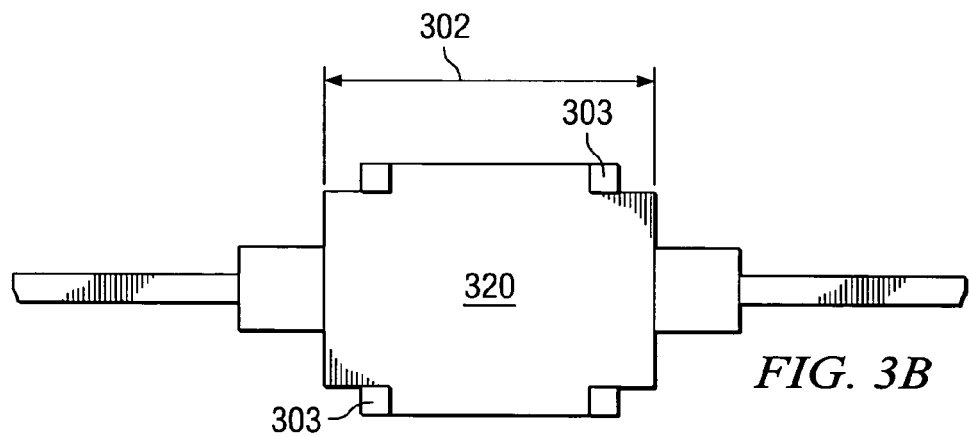
FIG. 3B is a schematic top view of a leadframe according to an embodiment of the invention.

FIGS. 3A and 3B depict an embodiment of the present invention, which solves the problem described in FIG. 2. FIG. 3A is a schematic cross section of a portion generally designated 300 of a leadframe made from material 301. Material 301 may be a planar metal sheet, or it may be cast. The portion shown in FIG. 3A includes a pad of width 302, which is operable for mounting a workpiece, especially a heat-generating workpiece such as a semiconductor chip, multi-chip, micromechanical device, or any object that needs to be kept within a pre-determined temperature range during operation. The portion further includes a plurality (preferably two or more) of non-planar members 303a and 303b, which are operable as mechanical stabilizers configured to secure inserted objects. Members 3a and 3b adjoin pad 302.

In the example shown in FIG. 3A, members 303a and 303b have shapes resembling elongated protrusions or thorns; in other examples (see FIG. 12A), the members may resemble dimples; many other shapes are useful. The members project from the planar sheet of the leadframe at an angle 310, which can be selected so that it is acute, right, or obtuse. In the example of FIG. 3A, angle 310 is approximately 90°. Generally, the non-coplanarity of the members is provided by a bend 311 in said members near their attachment to the leadframe.

The leadframe depicted in the example of FIG. 3A is preferably made of copper or a copper alloy in the preferred thickness range from 100 to 300 µm; thinner sheets are possible. When a leadframe is cast, thicker materials are useful. The ductility in the thickness range quoted provides the 5 to 15% elongation that facilitates the segment bending and forming operation. The leadframe, including the members, is stamped or etched from the starting metal sheet.

Alternative sheet metals include brass, aluminum, iron-nickel alloys (such as "Alloy 42"), and covar. Frequently, the sheet metal is fully covered with a plated layer; as an example, the copper base metal may be plated with a nickel layer.

FIG. 3B is a schematic top view of the leadframe portion shown in FIG. 3A. The mount pad 320 with width 302 is in one plane, while the plurality of members 303 are bent away from the mount pad plane and are thus non-coplanar. As FIG. 3B shows, members 303 are abutting pad 320.

Figure 4:
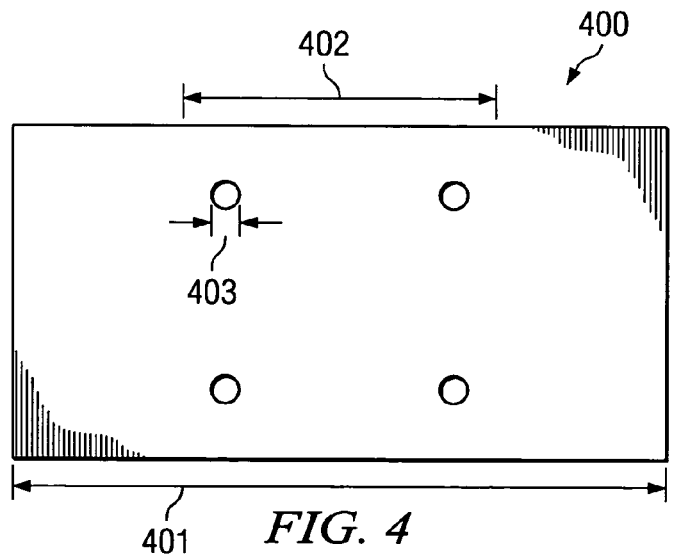
FIG. 4 is a schematic top view of a heat spreader according to an embodiment of the invention.

The schematic top view of FIG. 4 illustrates an example of a heat spreader, generally designated 400, with length 401. Spreader 400 functions to conduct and distribute the thermal energy generated by the workpiece attached to the leadframe. The heat spreader is thus preferably made of copper in the thickness range from about 0.2 to 5 mm (some devices may have considerably thicker heat spreaders), since copper combines good thermal conduction and thermal capacitance with low cost. Alternative heat spreader metals include copper alloys including brass, silver, and silver alloys. A thick enough heat spreader can also act as a heat sink in the first operational phases of a heat-generating workpiece.

Heat spreaders may be manufactured in a wide variety of shapes. In FIG. 4, the center portion 402 of the spreader is a planar pad, which matches the leadframe pad size. Beyond the center 402, the spreader may extend over a considerable area. There is a plurality of contours 403 in the spreader, which are suitable for insertion of the leadframe members. The contours may include openings, holes, grooves, or other forms of recess.

Figure 5:
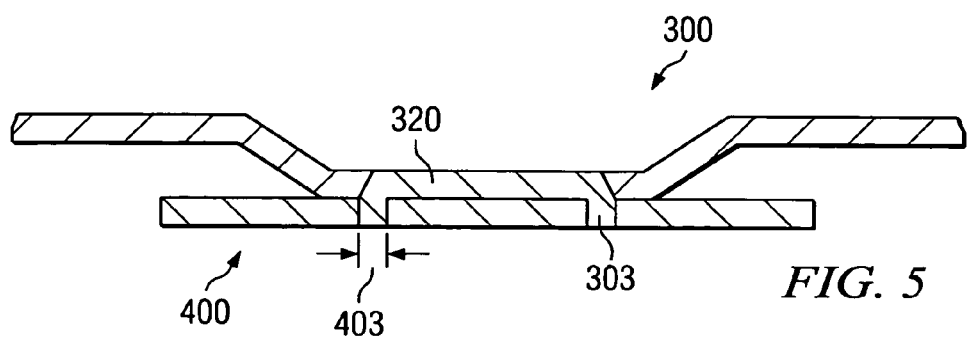
FIG. 5 is a schematic cross section of an apparatus comprising a leadframe and a heat spreader inserted into leadframe members according to an embodiment of the invention.

The cross section of FIG. 5 illustrates the leadframe 300 (FIG. 3A) with its members 303 operable as mechanical stabilizers configured to secure the inserted heat spreader 400 (FIG. 4). Since members 303 adjoin pad 320, spreader 400 will be positioned, after stabilization, in parallel and in touch with pad 320. The contours 403 of the spreader match the leadframe members 303 in number, location, and size so that members 303 fit into contours 403. In this manner, the heat spreader 400 is stabilized and secured relative to the leadframe 300, when the leadframe with its attached workpiece has to undergo the molding process.

Figure 6:
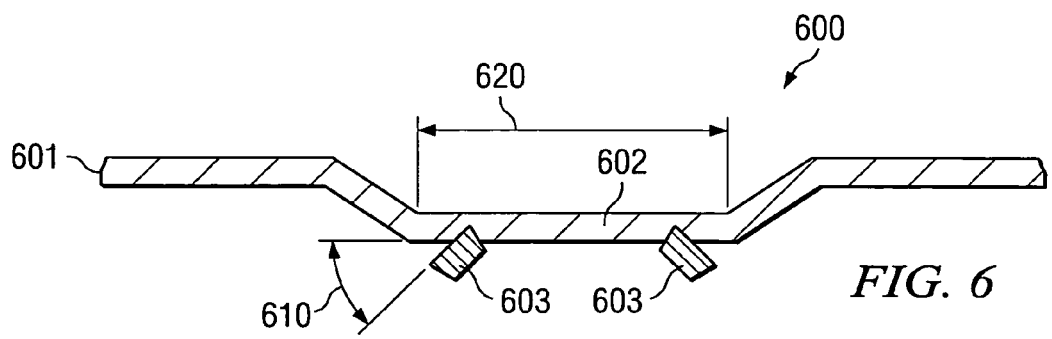
FIG. 6 is a schematic cross section of a leadframe according to another embodiment of the invention.
Figure 7:
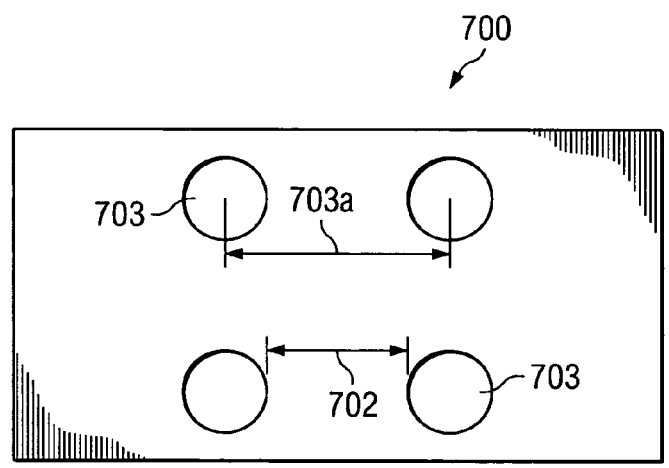
FIG. 7 is a schematic top view of a heat spreader according to another embodiment of the invention.
Figure 8:
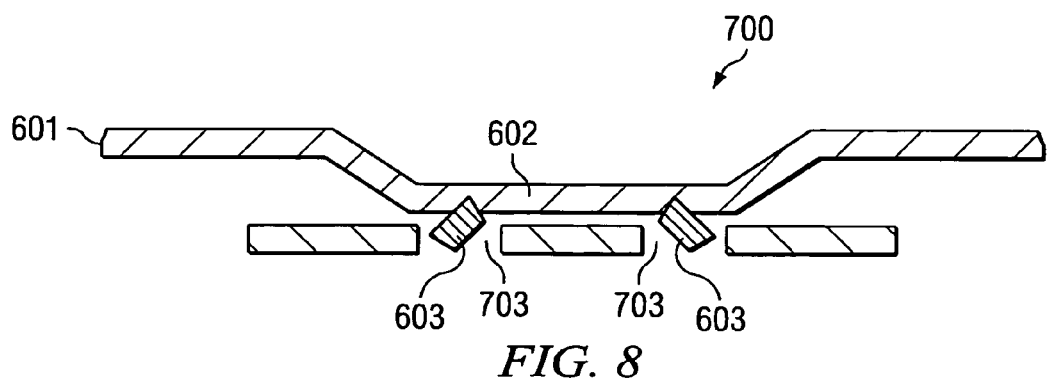
FIG. 8 is a schematic cross section of an apparatus comprising a leadframe and a heat spreader inserted into leadframe members according to another embodiment of the invention.

FIGS. 6 to 8 describe another embodiment, which is closely related to the embodiment depicted in FIGS. 3A to 5. FIG. 6 is a schematic cross section of a portion generally designated 600 of a leadframe made from a material 601; the portion includes a pad 602, which is planar and thus operable for mounting a workpiece, especially a heat-generating workpiece such as a semiconductor chip or a micro-mechanical device. The portion further includes a plurality of non-planar members 603, which are adjoining pad 602 and operable as mechanical stabilizers configured to secure inserted objects. Members 603 are bent from the plane of pad 602 by an angle 610 less than 90°. At the point of bending, members 601 are apart by a distance 620.

The heat spreader depicted in FIG. 7, generally designated 700, has a center portion 702, which approximately matches the leadframe pad size. There is a plurality of contours 703 in the spreader, which are suitable for insertion of the leadframe members. Contours 703 are illustrated as openings, which are apart by a distance 703a center-to-center. Distance 703a is at least as wide as member distance 620 in FIG. 6 so that members 603 fit into openings 703 respectively. Instead of having round shape, openings 703 may have any other suitable shape.

FIG. 8 illustrates the leadframe 600 (FIG. 6) with its members 603 operable as mechanical stabilizers configured to secure the inserted heat spreader 700 (FIG. 7). Since members 603 adjoin pad 602, spreader 700 will be positioned, after stabilization, in parallel and in touch with pad 602. The contours 703 of the spreader match the leadframe members 603 in number, location, and size so that members 603 fit into contours 703. In this manner, the heat spreader 700 is stabilized and secured relative to the leadframe 600, when the leadframe with its attached workpiece has to undergo the molding process.

Figure 9:
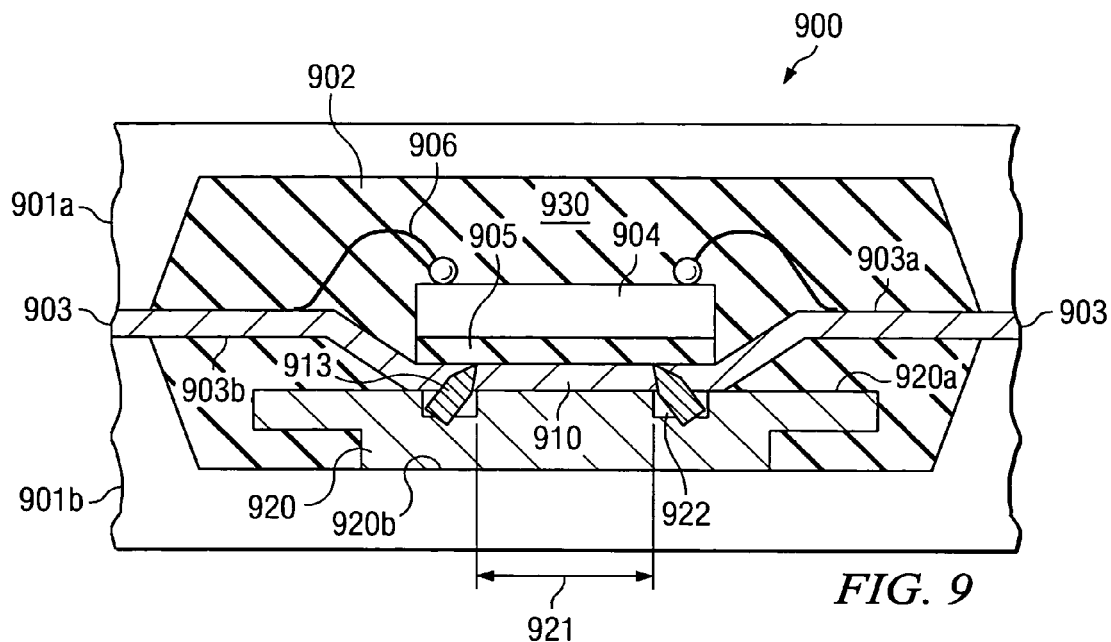
FIG. 9 is a schematic cross section of a mold after filling the mold cavity with a mold compound, the cavity containing a leadframe, with assembled semiconductor chip, and a heat spreader inserted into leadframe members according to the invention.

The schematic cross section of FIG. 9 illustrates a mold, generally designated 900 and preferably made of stainless steel, with upper mold half 901a and lower half 901b as commonly used in the transfer molding process of semiconductor device packaging. When placed on top of each other as shown in FIG. 9, the mold halves define the mold cavity 902, which has been filled with molding compound 930. A leadframe 903 has been loaded in the mold cavity; it is held in place by pressing the mold halves together. On the first surface 903a of planar pad 910 of leadframe 903 is a semiconductor chip 904 mounted. The mounting step includes the attachment of chip 904 to first leadframe surface 903a using the adhesive 905 (preferably an epoxy or a polyimide), and the electrical connection of chip bond pads to leadframe segments (only schematically shown in FIG. 9) using connecting wires 906.

Adjoining leadframe planar pad 910 is a plurality of non-coplanar members 913, which are bent, in the example of FIG. 9, from the leadframe planar pad 910 by an angle less than 90° (as mentioned earlier, larger angles are possible).

Heat spreader 920 has first surface 920a and second surface 920b. Heat spreader 920 has a spreader planar pad 921 of a width matching approximately the width of leadframe planar pad 910; beyond spreader planar pad 921, spreader 920 stretches over considerable distance. The first surface 920a of spreader 920 faces second surface 903b of leadframe 903. The second surface 920b of the spreader rests on the steel of the lower mold half 901b.

Spreader 920 further has a plurality of contours 922, which match the number, location and size of leadframe members 913. In the example of FIG. 9, contours are depicted as indentations of a depth suitable for members 913. Leadframe members 913 are inserted into spreader contours 922, respectively, so that first surface 920a of spreader planar pad 921 touches second leadframe surface 903b approximately across the leadframe planar pad width 910. By this contact, good thermal conduction from chip 904 to heat spreader 920 is established.

When molding compound 930 is transferred into cavity 902, spreader 920 is stabilized relative to leadframe 903 and cannot be shifted by the progressing front of the compound as it is pressed into the mold cavity through the mold gate. When the finished device is removed from the mold, the second spreader surface 920b is exposed to an external part exactly in the location defined in the device specifications.

Figure 10A:
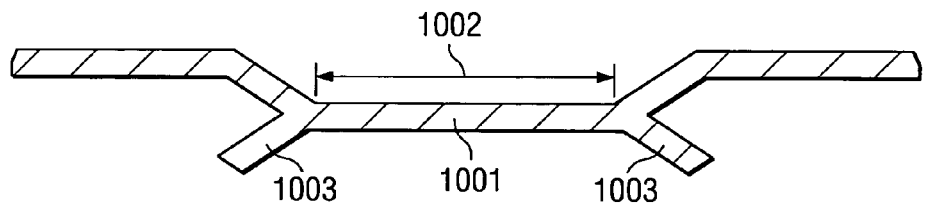
FIG. 10A is a schematic cross section of a leadframe according to another embodiment of the invention.
Figure 10B:
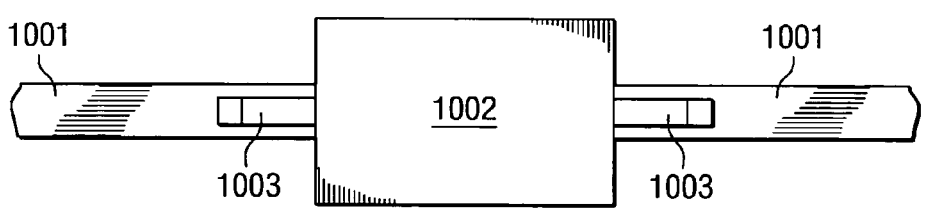
FIG. 10B is a schematic top view of a leadframe according to another embodiment of the invention.
Figure 11:
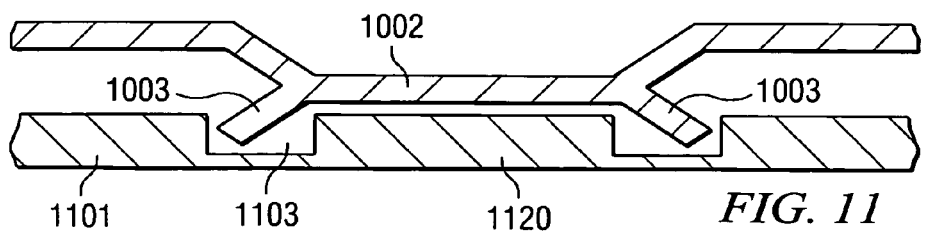
FIG. 11 is a schematic cross section of an apparatus comprising a leadframe and a heat spreader inserted into leadframe members according to another embodiment of the invention.

FIGS. 10A, 10B, and 11 show an embodiment of the invention, wherein the leadframe has only two members and the heat spreader accordingly only two contours. FIG. 10A illustrates the leadframe 1001 with leadframe pad 1002 and the non-coplanar members 1003 abutting leadframe pad 1002.

FIG. 10B is a schematic top view of leadframe 1001. The leadframe pad 1002 of a size to accommodate a semiconductor chip is adjoined by the members 1003; there are only two members in this embodiment. The cross section of FIG. 11 illustrates how the members 1003 fit into the contours 1103 of the heat spreader 1101. The size of planar pad 1120 of spreader 1103 approximately matches the size of leadframe pad 1002. After leadframe members 1003 have secured the inserted spreader 1101, leadframe pad 1002 touches spreader pad 1120 in a tight fit designed to enable the transfer of thermal energy from the leadframe to the heat spreader.

Figure 12A:
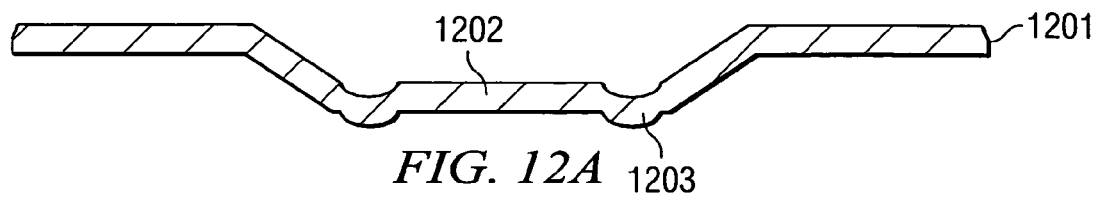
FIG. 12A is a schematic cross section of a leadframe according to another embodiment of the invention.
Figure 12B:
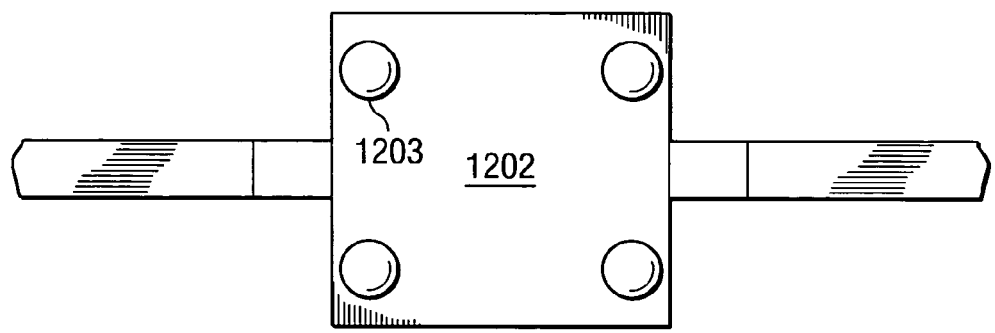
FIG. 12B is a schematic top view of a leadframe according to another embodiment of the invention.
Figure 13:
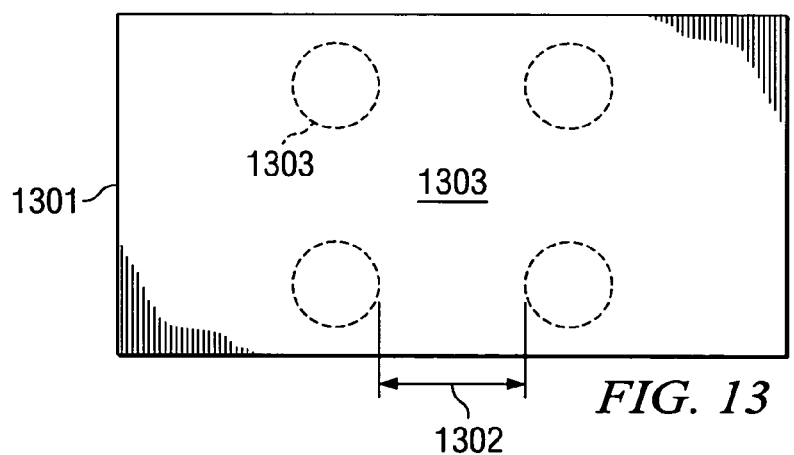
FIG. 13 is a schematic top view of a heat spreader according to another embodiment of the invention.

FIGS. 12A to 14 illustrate another embodiment of the invention. The cross section of FIG. 12A shows that leadframe 1201 has planar pad 1202 with abutting members 1203, which are formed as dimples. The top view of FIG. 12B marks the location of dimples 1203 in the four corners of leadframe pad 1202. FIG. 13 show the top view of heat spreader 1301 with contours 1303 formed as indents, which match leadframe dimples 1203 in number, location and approximate size. Between indents 1303, spreader 1301 has a planar portion 1302 matching planar leadframe pad 1202.

Figure 14:
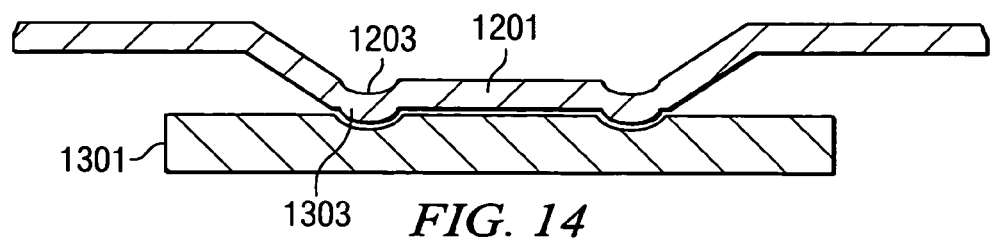
FIG. 14 is a schematic cross section of an apparatus comprising a leadframe and a heat spreader inserted into leadframe members according to another embodiment of the invention.

The cross section of FIG. 14 illustrates the insertion of leadframe dimples in the spreader indents 1303. The spreader is thus secured and stabilized for the transfer molding step in the mold cavity.

FIGS. 15A to 17 describe another embodiment of the invention, which employs an additional thermally conductive attach material for the stabilization of heat spreader and leadframe. The additional strength of adhesives may be useful for additional stabilization. In FIG. 15A, the leadframe 300 of FIG. 3A is shown upside down. The planar pad 302 (on the "downside" in FIG. 15A) is reserved for mounting the workpiece, but the opposite planar leadframe area 304 between members 303a and 303b (on the "upside" in FIG. 15A) has a thermally conductive adhesive 1501. A preferred material is silver-filled epoxy; an alternative is silver-filled polyimide. The top view of FIG. 15B shows this adhesive 1501 between the four members 303, which adjoin leadframe pad 302.

In FIG. 16, the planar pad 404 of heat spreader 400 (see FIG. 4) is attached to the planar pad 304 of leadframe 300, while leadframe 300 is still in upside down position. The leadframe members 303 are inserted in spreader contours 403 and furthermore the adhesive 1501 attaches planar pads 304 and 404. Reversing the upside down position, FIG. 17 illustrates the mounting of a semiconductor chip on leadframe pad 302, employing thermally conductive chip attach material 1702 and wire bonding 1702. Preferred attach materials include silver-filled epoxy and silver-filled polyimide.

Thermal energy flows along a short path from the heat-generating chip 1710 through attach material 1701, the metallic leadframe pad 302, and the attach material 1501 to the heat spreader pad 404. This path will remain undisturbed by the molding process due to the stable anchoring of the leadframe members 303 in the spreader contours 403 and the additional adhesive 1501 between leadframe pad 302 and spreader pad 404.

Another embodiment of the invention is a method for fabricating a semiconductor device. The method begins by providing a leadframe, which may be made from a planar metal sheet or may be cast or otherwise machined. The leadframe includes a pad of a certain size; it has first and second surfaces and a plurality of non-coplanar members operable as mechanical stabilizers configured to secure inserted objects; these members adjoin the pad. The next step provides a heat spreader, which has first and second surfaces, a planar pad of a size approximately matching the leadframe pad size, and contours suitable for insertion of the leadframe members. Beyond its planar pad, the spreader may stretch over considerable distances.

In the next step, the leadframe members are inserted into the spreader contours so that the first spreader pad surface touches the second leadframe pad surface across the pad size. It is optional to attach the first spreader pad surface to the second leadframe pad surface using a thermally conductive adhesive.

Next, a workpiece such a semiconductor chip or a micromechanical device is provided; the chip is mounted on the first leadframe pad surface. Finally, the mounted chip is encapsulated so that the second spreader surface remains uncovered. In detail, the encapsulation step first places the spreader together with the inserted leadframe and the mounted chip on the bottom of the mold cavity so that the second spreader surface rests on the mold bottom. The mold is then closed and the molding compound is transferred into the cavity, whereby any movements of the spreader relative to the leadframe are inhibited, because the leadframe members are inserted into the spreader contours. Finally, the molding compound is polymerized and hardened.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing. As another example, micromechanical devices or any device, which needs to be kept within a predetermined temperature range during operation, may be used. As another example, the concept of the invention is effective for many semiconductor device technology nodes and not restricted to a particular one. As yet another example, number, shape, and location of the leadframe members and the corresponding heat spreader contours may vary from device type to device type. It is therefore intended that the appended claims encompass any such modifications or embodiments.

We claim:

1. A method for fabricating a semiconductor device comprising the steps of:

providing a leadframe made from a planar metal sheet, said leadframe including a leadframe pad of a size, having first and second surfaces and a plurality of non-coplanar members bent away form the first surface and past the second surface, operable as mechanical stabilizers configured for insertion in contours, said plurality of non-coplanar members adjoining said leadframe pad;

providing a heat spreader having first and second surfaces, a planar pad of a size matching said leadframe pad size, and contours suitable for insertion of said plurality of non-coplanar members;

inserting said plurality of non-coplanar members into said contours so that said first surface of said heat spreader touches said second surface of said leadframe across said leadframe pad;

providing a semiconductor chip and mounting said semiconductor chip on said first surface of said leadframe; and encapsulating said semiconductor chip, while leaving said second surface of said heat spreader uncovered.

2. The method according to claim 1 wherein said step of encapsulating comprises the steps of:

placing said heat spreader together with said inserted leadframe and the semiconductor chip on a bottom of a mold cavity so that said second surface of said heat spreader rests on the bottom of the mold cavity;

closing said mold cavity and transferring molding compound into said mold cavity, whereby movements of said heat spreader relative to said leadframe are inhibited by said plurality of non-coplanar members inserted into said heat spreader; and polymerizing and hardening said molding compound.

3. A method for fabricating a semiconductor device comprising the steps of:

attaching a semiconductor chip on a first surface of a leadframe pad, the leadframe pad having mechanical stabilizers at edges of the pad bending away from the chip and below the leadframe pad;

inserting the mechanical stabilizer into contours on a first surface of a heat spreader, thereby attaching a second surface of the leadframe pad opposite the first surface of the leadframe pad to the first surface of the heat spreader; and encapsulating said semiconductor chip, leaving a second surface of the heat spreader opposite the first surface of the heat spreader exposed from the encapsulation.

4. The method of claim 3, in which the step of attaching the second surface of the leadframe pad to the first surface of the heat spreader further comprising applying a thermally conductive adhesive between the pad and the heat spreader.

* * * * *